US009335376B2

(12) United States Patent  (10) Patent No.: US 9,335,376 B2
Cheng et al.  (45) Date of Patent: May 10, 2016

(54) TEST ARCHITECTURE FOR CHARACTERIZING INTERCONNECTS IN STACKED DESIGNS

(71) Applicant: Mentor Graphics Corporation, Wilsonville, OR (US)

(72) Inventors: Wu-Tung Cheng, Lake Oswego, OR (US); Ruifeng Guo, Portland, OR (US); Yu Huang, Sudbury, MA (US); Liyang Lai, Wilsonville, OR (US); Jing Ye, Beijing (CN); Yu Hu, Beijing (CN)

(73) Assignee: Mentor Graphics Corporation, Wilsonville, OR (US)

( * ) Notice: Subject to any disclaimer, the term of this patent is extended or adjusted under 35 U.S.C. 154(b) by 61 days.

(21) Appl. No.: 14/183,305

(22) Filed: Feb. 18, 2014

(65) Prior Publication Data

US 2014/0237310 A1  Aug. 21, 2014

Related U.S. Application Data

(60) Provisional application No. 61/766,545, filed on Feb. 19, 2013.

(51) Int. Cl.
 *G01R 31/3185* (2006.01)
(52) U.S. Cl.
 CPC .. *G01R 31/318541* (2013.01); *G01R 31/31855* (2013.01); *G01R 31/318513* (2013.01)
(58) Field of Classification Search
 CPC .............................................. G01R 31/318536
 USPC .................................. 714/726, 727, 729, 734
 See application file for complete search history.

(56) References Cited

U.S. PATENT DOCUMENTS

| 6,028,436 A * | 2/2000 | Akram et al. ............. 324/754.03 |
| 8,732,632 B1 * | 5/2014 | Keller et al. .................. 716/102 |
| 2014/0055158 A1 * | 2/2014 | Whetsel et al. .......... 324/756.03 |

OTHER PUBLICATIONS

E. J. Marinissen and Y. Zorian, "Testing 3D Chips Containing Through-Silicon Vias," Proc. of International Test Conference (ITC), 2009.
S. Deutsch, V. Chickermane, S. Mukherjee, B. Sood, S. K. Goel, J.-J. Chen, A. Mehta, F. Lee, and E. J. Marinissen, "DfT Architecture and ATPG for Interconnect Tests of JEDEC Wide-I/O Memory-on-Logic Die Stacks," Proc. of International Test Conference (ITC), paper 12.4, 2012.
J. Ye, R. Guo, Y. Hu, W.-T. Cheng, Y. Huang, L. Lai, and X. Li, "Design for Testing 3D-TSVs connecting Logic Die and Memory Die," Proc. of 3D Test Workshop, 2012.
Y.-H. Lin and S.-Y. Huang, "A Unified Method for Parametric Fault Characterization of Post-Bond TSVs", Proc. of International Test Conference (ITC), paper 12.1, 2012.
S.-Y. Huang, Y.-H. Lin, K.-H. Tsai, W.-T. Cheng, S. Sunter, Y.-F. Chou, and D.-M. Kwai, "Small Delay Testing for TSVs in 3-D ICs," Proc. of DAC, pp. 1031-1036, 2012.

(Continued)

*Primary Examiner* — Fritz Alphonse (57) ABSTRACT

The disclosed ring-oscillator-based test architecture comprises a plurality of boundary scan cells coupled to a plurality of interconnects and control circuitry. Each of the plurality of boundary scan cells can be configured to operate as, based on control signals, a conventional boundary scan cell or any bit of an asynchronous counter. The control signals are supplied by the control circuitry.

10 Claims, 8 Drawing Sheets

(56) References Cited

OTHER PUBLICATIONS

J.-W. You, S.-Y. Huang, D.-M. Kwai, Y.-F. Chou, and C.-W. Wu, "Performance Characterization of TSV in 3D IC via Sensitivity Analysis," Proc. of Asian Test Symposium (ATS), pp. 389-394, 2010.

L. S. Dutta and T. Hillmann-Ruge, "Application of Ring Oscillators to Characterize Transmission Lines in VLSI Circuits," IEEE Trans. Components, Packaging, Manufacturing Technology, Part. B, vol. 18, No. 4, pp. 651-657, Nov. 1995.

W. C. Wu, C.-L. Lee, M. S. Wu, J. E. Chen, and M. Abadir, "Oscillation Ring Delay Test for High Performance Microprocessor", Journal. of Electronic Testing: Theory and Applications (JETTA), vol. 16, No. 1-2, pp. 147-155, 2000.

A. Bassi, A. Veggetti, L. Croce, and A. Bogliolo, "Measuring the Effects of Process Variations on Circuit Performance by Means of Digitally Controllable Ring Oscillators," Proc. of Microelectronic Test Structures, pp. 214-217, 2003.

K. S.-M. Li, C.-L. Lee, C.-C. Su, and J. E. Chen, "Oscillation Ring based Interconnect Test Scheme for SoC," Proc. of IEEE Asia South Pacific Design Automation Conference (ASP-DAC), pp. 184-187, 2005.

K. S.-M. Li, C.-L. Lee, C.-C. Su, Y.-M. Chang, and J.-E Chen, "IEEE Standard 1500 Compatible Sscillation Ring Test Methodology for Interconnect Delay and Crosstalk Detection," Journal of Electronic Testing: Theory and Applications, vol. 23, No. 4, pp. 341-355, Aug. 2007.

B. P. Das, B Amrutur, H. S. Jamadagni, N. V. Arvind, and V. Visvanathan, "Within-Die Gate Delay Variability Measurement using Re-configurable Ring Oscillator," Proc. of Custom Integrated Circuits Conference (CICC), pp. 133-136, 2008.

X. Wang, M. Tehranipoor, S. George, D. Tran, and L. Winemberg, "Design and Analysis of a Delay Sensor Applicable to Process/ Environmental Variations and Aging Measurements," IEEE Trans. Very Large Scale Integration (VLSI) Systems, vol. 20, No. 8, pp. 1405-1418, 2012.

\* cited by examiner (1) Pre-Bond

FIG. 1A

(2) Post-Bond

TEST ARCHITECTURE FOR CHARACTERIZING INTERCONNECTS IN STACKED DESIGNS

RELATED APPLICATIONS

This application claims priority to U.S. Provisional Patent Application No. 61/766,545, filed on Feb. 19, 2013, and naming Wu-Tung Cheng et al. as inventors, which application is incorporated entirely herein by reference.

FIELD OF THE INVENTION

The present invention relates to the field of integrated circuit (IC) testing technology. Various implementations of the invention may be particularly useful for testing and characterizing interconnects of stacked integrated circuits.

BACKGROUND OF THE INVENTION

Expanding into the third dimension enables chip manufacturers to continue shrinking transistors to boost speed without adding power leaks. However, chip stacking is limited by wiring-related problems. Today's interconnects do not run through the silicon itself but go millimeters around it, impeding speedy signaling and increasing power consumption along the way. 2-D (horizontal) real estate is also valuable. Even the thinnest interconnects must still be packed along the edges of a chip, imposing strict limits on how many input/output connections the chip can handle. Consequently, going vertical (3-D) by connecting one chip to another with lines that go straight through the silicon—commonly known as through-silicon vias (TSVs)—offers the numerous potential benefits. In particular, more connections can be packed side by side using much slimmer wires. Going through chips instead of around the side also reduces the length of interconnects from millimeters to microns or even less—as thin as individual wafers can be produced. It has been estimated that the switch to vertical interconnects may reduce power consumption in half, increase bandwidth by a factor of eight, and shrink memory stacks by some 35 percent.

As several hundreds of thousands of TSVs in a single package provide power/ground, clock, functional signals, as well as test access to logic blocks of different layers of the device, they become not only the key components of 3-D ICs but also make up a crucial test infrastructure. In order to form TSVs, one has to etch deep, narrow holes into a silicon wafer and then fill them with a nearly flawless layer of insulating material and then copper. But as a wafer heats up, copper expands at more than five times the rate that silicon does, exerting stress that can crack the wafer and render it useless. Because of such imperfect etching, ragged wafer surface, and potential wafer misalignments, certain TSVs in one wafer after thinning and polishing might not be completely exposed or aligned with their counterparts on the other wafer. Since the bonding quality of TSVs depends on the winding level of the thinned wafer as well as the surface roughness and cleanness of silicon dies, defective TSVs tend to occur in clusters, though even a single TSV defect between any two layers can void the entire chip stack, reducing the overall yield.

Figure 1A:
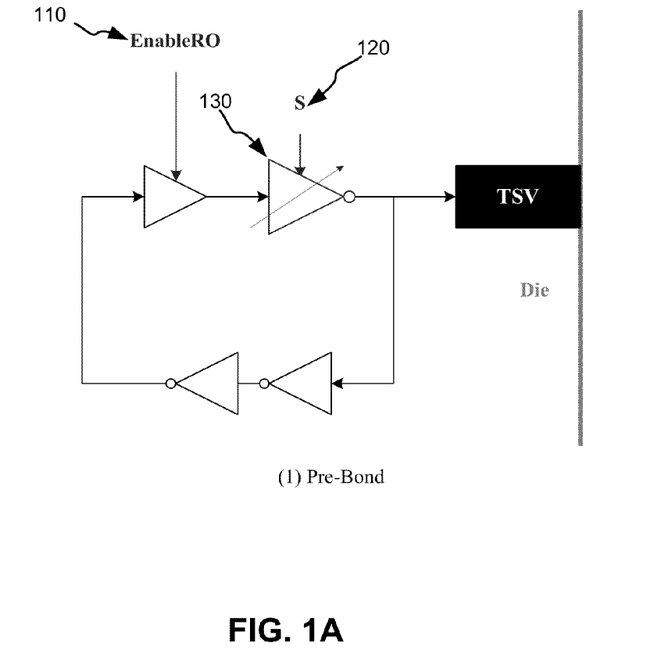
FIG. 1A illustrates an example of a ring oscillator for pre-bond testing
Figure 1B:
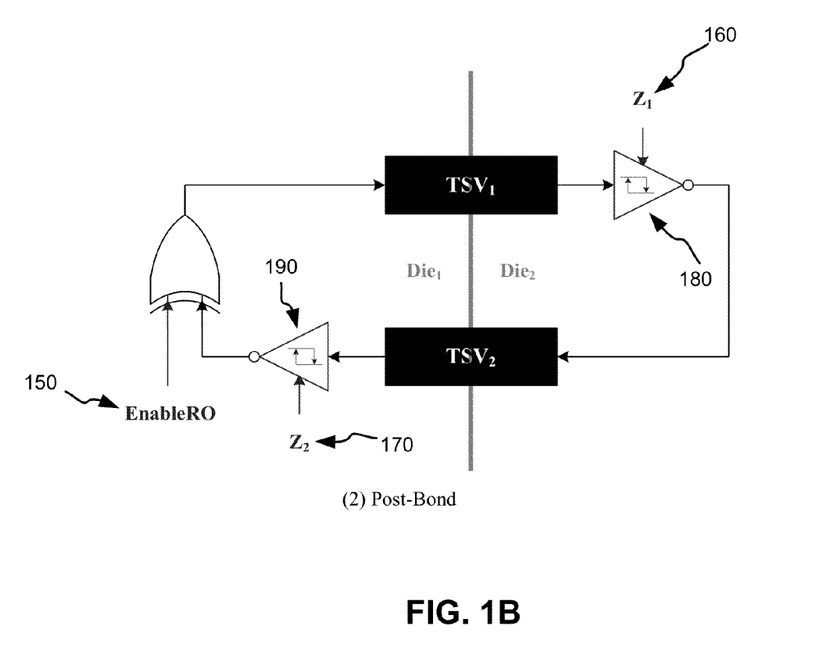
FIG. 1B illustrates an example of a ring oscillator for post-bond testing.

Numerous novel schemes for testing TSV-based interconnects have been proposed. Among them, the ring oscillator-based scheme is a promising technique. Using the technique, TSVs can be tested before and after dies are stacked together (pre-bond testing and post-bond testing). FIGS. 1A and 1B illustrate examples of pre-bond testing and post-bond testing, respectively. In the example of pre-bond testing, a ring oscillator is configured for each TSV. The ring oscillator oscillates when the signal EnableRO 110 is set to be 1. The signal S 120 can be used to adjust the drive strength of the inventor 130. During a test, oscillation periods are measured under two configurations: (1) S=0 and (2) S=1. In the example of post-bond testing, a ring oscillator is configured for each pair of TSVs. Similar to pre-bonding, the ring oscillator is activated by the signal EnableRO 150. When the signals $Z_1$ 160 and $Z_2$ 170 are set to be zero, the inverters 180 and 190 operate as normal inverters. When the Z1 (Z2) signal is set to be 1, the inverter 180 (190) can be converted to a Schmitt-Trigger inverter. The post-bond testing comprises measuring oscillation periods under three configurations: (1) Post-Config$_1$: $Z_1Z_2$=00, (2) Post-Config$_2$: $Z_1Z_2$=10 and (3) Post-Config$_3$: $Z_1Z_2$=01.

Figure 2:
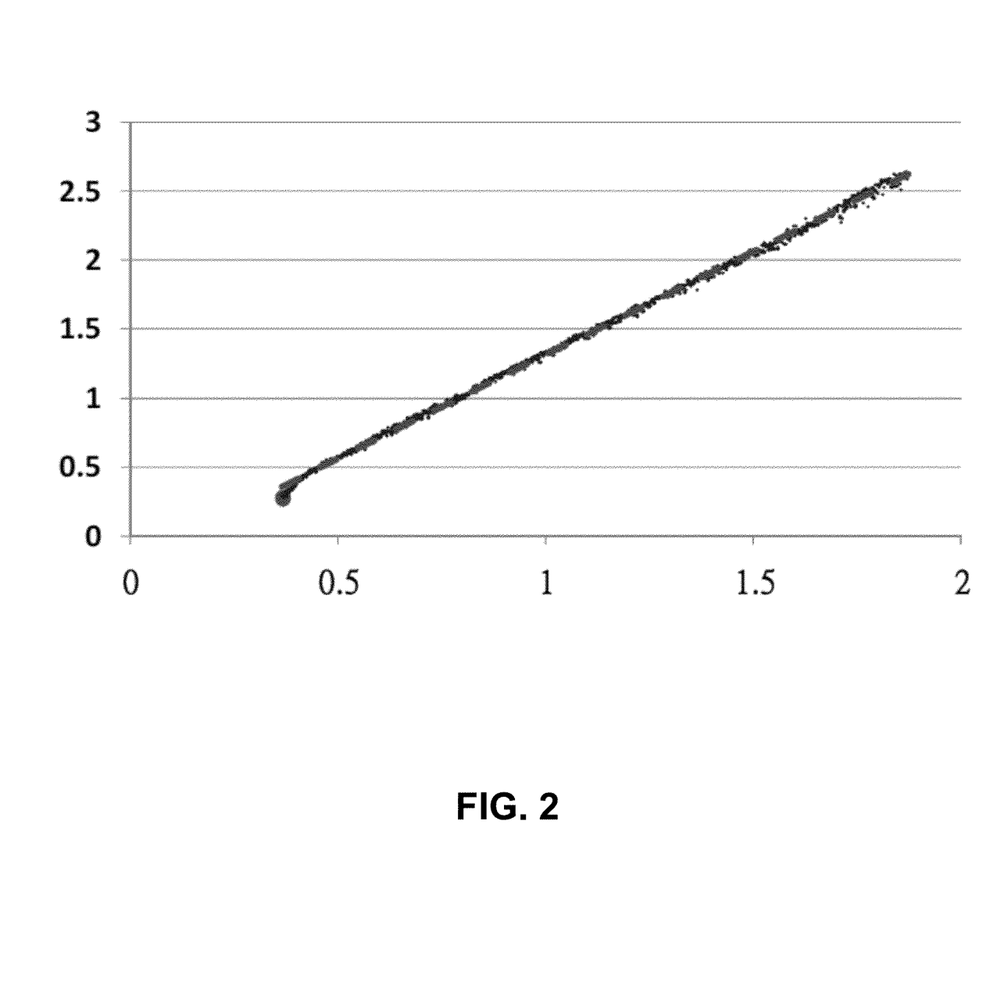
FIG. 2 illustrates an example of the relationship between the propagation delay of one TSV in a post-bond measurement setting and the oscillation period difference between two configurations.

TSVs can be characterized by analyzing the measured oscillation periods under the two (three) configurations for pre-bond (post-bond) testing. This is because the oscillation period of a ring oscillator depends on the TSV-based propagation delay. FIG. 2 illustrates an example of the relationship between the propagation delay of one TSV in the post-bond measurement setting (FIG. 1B) and $\Delta$Period (=period of Post-Config$_2$−period of Post-Config$_1$) when no process variation exists. In the figure, the horizontal axis represents the propagation delay and the vertical axis represents $\Delta$Period, both in the unit of nanosecond. By measuring the oscillation periods, not only the fault type of a parametric fault such as the resistive open fault and the leakage fault can be identified, but the fault effects in terms of propagation delay, voltage swing, or leakage current can be accessed. Powerful as the ring oscillator-based scheme is, there are challenges in implementing it. As a die may have at least hundreds of TSVs, test time, silicon area and routing are important factors that may determine whether a test architecture for the ring oscillator-based scheme is feasible or not.

BRIEF SUMMARY OF THE INVENTION

Aspects of the invention relate to ring-oscillator-based test architecture for characterizing interconnects in stacked designs.

In one aspect, there is an integrated circuit to be fabricated on a first die comprising: a plurality of interconnection elements for communicating with another integrated circuit to be fabricated on a second die, the second die being adjacent to the first die when the first die and the second die are stacked or being mounted on a same substrate as the first die; a plurality of boundary scan cells coupled to the plurality of interconnection elements, wherein each of the plurality of boundary scan cells can be configured to operate as, based on control signals, a conventional boundary scan cell or any bit of an asynchronous counter; and control circuitry that supplies the control signals.

The plurality of interconnection elements may be through-silicon vias. The conventional boundary scan cell may be an IEEE Standard 1149.1 compliant device.

An integrated circuit according to the one aspect may further comprise devices for constructing ring oscillators for pre-bond testing of the plurality of interconnection elements, post-bond testing of the plurality of interconnection elements, or both. The control circuitry may further supply signals for enabling the ring oscillators.

In a further aspect, there is one or more non-transitory processor-readable media storing processor-executable instructions for causing one or more processors to create a design of an integrated circuit, to be fabricated on a first die, the integrated circuit comprising: a plurality of interconnection elements for communicating with another integrated circuit to be fabricated on a second die, the second die being adjacent to the first die when the first die and the second die are stacked or being mounted on a same substrate as the first die; a plurality of boundary scan cells coupled to the plurality of interconnection elements, wherein each of the plurality of boundary scan cells can be configured to operate as, based on control signals, a conventional boundary scan cell or any bit of an asynchronous counter; and control circuitry that supplies the control signals.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

DETAILED DESCRIPTION OF THE INVENTION

Various aspects of the present invention relate to ring-oscillator-based test architecture for characterizing interconnects in stacked designs. Two examples of interconnects are TSVs for three-dimensional designs and interposers for two-and-half-dimensional designs. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on one or more non-transitory computer-readable media, software instructions executed on a processor, or some combination of both. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device. Some of the disclosed techniques, for example, can be implemented as part of an electronic design automation (EDA) tool. Such methods can be executed on a single computer or on networked computers.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

The present disclosure also includes some hardware drawings. These drawings are only schematic and are non-limiting. For illustrative purposes, the size of some of the elements in the drawings may be exaggerated and not drawn on scale, and some elements in the drawings may be omitted.

Characterizing interconnects of stacked dies is not the first application of ring oscillators. Different types of ring oscillators have been developed for delay test, process variation extraction, aging measurement, and et al. A common approach to measure a ring oscillator' oscillation period is to count the number of rising edges of the ring oscillator signal within a certain period time, called measurement window. If the width of a measurement window is denoted as $T_W$, and the number of rising edges in $T_W$ is $N_{RE}$, the oscillation period can be derived as $T_W/N_{RE}$.

The measurement precision may be evaluated by relative-measurement-error, defined as $|P_A-P_C|/P_A$. Here, $P_A$ denotes the actual period, and $P_C$ denotes the calculated period. For example, if $N_{RE}$=100 rising edges are counted in $T_W$=300 ns, the actual period could be more than 300 ns/(100+1)=2.97 ns and less than 300 ns/(100−1)=3.03 ns. Since the period is calculated to be 300 ns/100=3 ns, the relative-measurement-error is less than 1%. To achieve high precision measurement, the measurement window should thus be wide enough to cover a sufficient large number of rising edges. For example, with a measurement window of 30000 ns that covers 10000 rising edges, a relative-measurement-error of less than 0.01% can be achieved. As the oscillation period of a ring oscillator is unlikely less than 1 ns, a 15-bit counter is sufficient to achieve high precision measurement.

Figure 3:
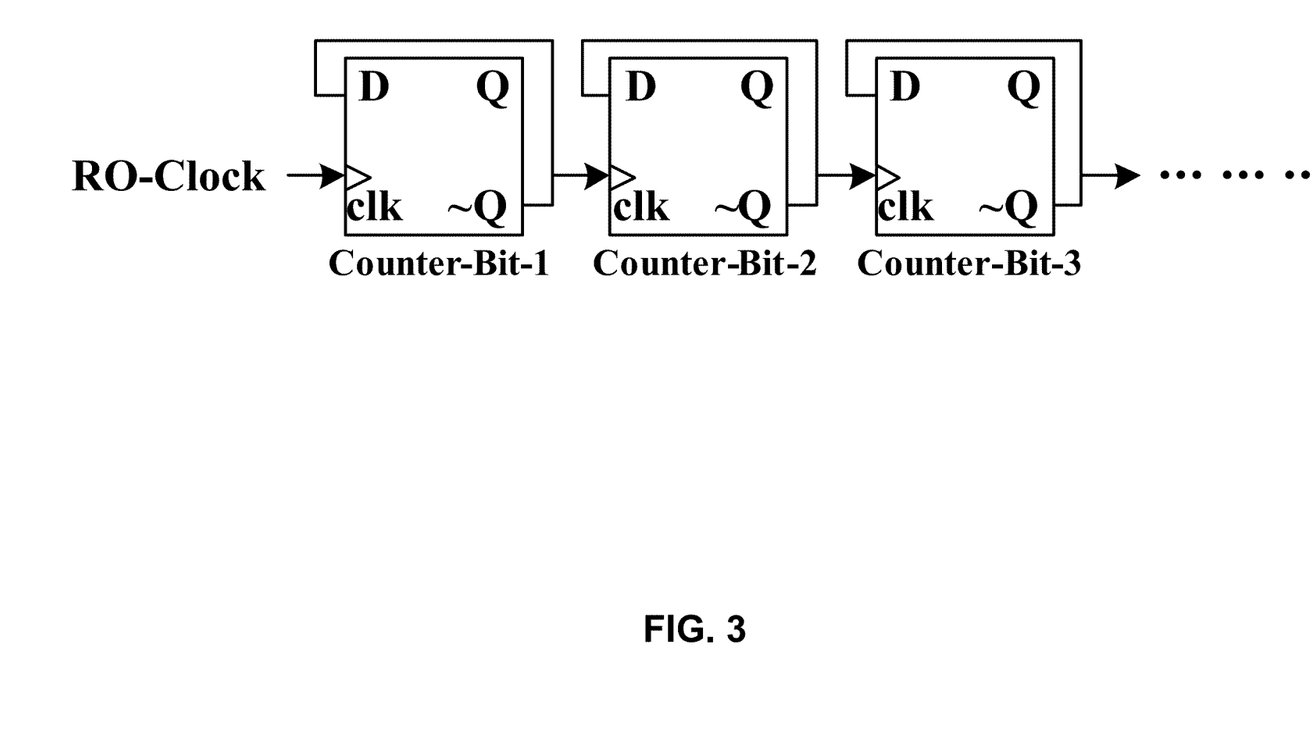
FIG. 3 illustrates an example of a three-bit asynchronous (ripple) counter.

A die to be stacked with other dies in a 3D configuration or with a substrate in a 2.5D configuration often has hundreds or even thousands of interconnects. Testing these interconnects in serial is impractical. Parallel testing, however, requires a large number of counters. To insert dedicated counters will lead to significant silicon area overhead. Boundary scan cells are usually used in stacked dies. Constructing counters dynamically by using existing boundary scan cells may reduce not only silicon area overhead but also routing overhead as they are locally connected with interconnects. With this approach, only asynchronous (ripple) counters instead of synchronous counters can be constructed due to the long wiring between boundary scan cells. The long wiring leads to long propagation delay from one boundary scan cell to its succeeding boundary scan cell. As a result, a boundary scan chain usually can only work at low speed clocks (e.g. 50 MHz with period=20 ns). This is much slower compared to the signal (about 3 ns) of a normal post-bond ring oscillator. For an asynchronous counter, however, only the first flip-flop (the first bit) of the counter needs to be able to work under the frequency of the ring oscillator. FIG. 3 illustrates an example of a three-bit asynchronous (ripple) counter.

Figure 4A:
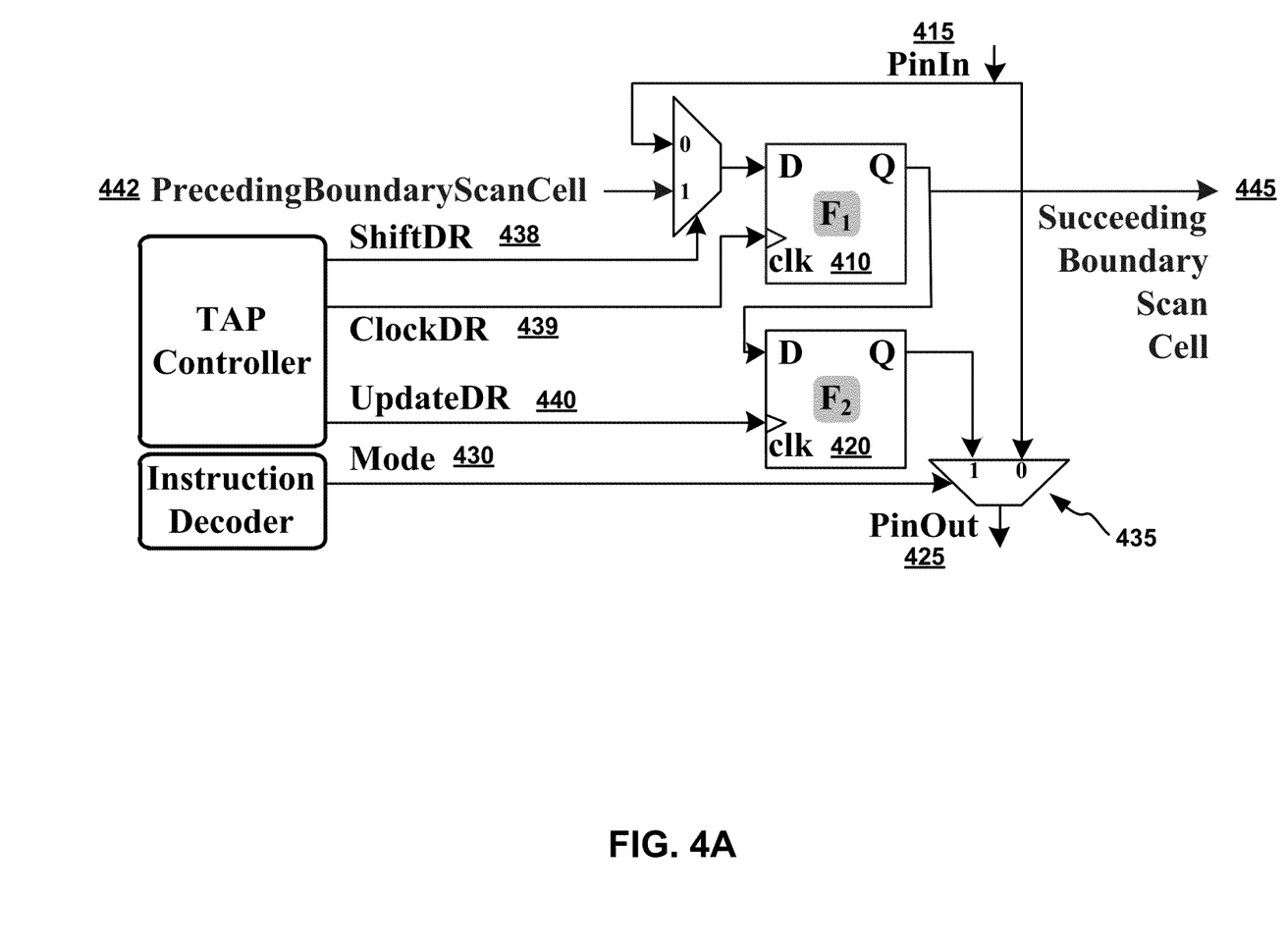
FIG. 4A illustrates a conventional boundary scan cell in compliance with the IEEE Standard 1149.1.
Figure 4B:
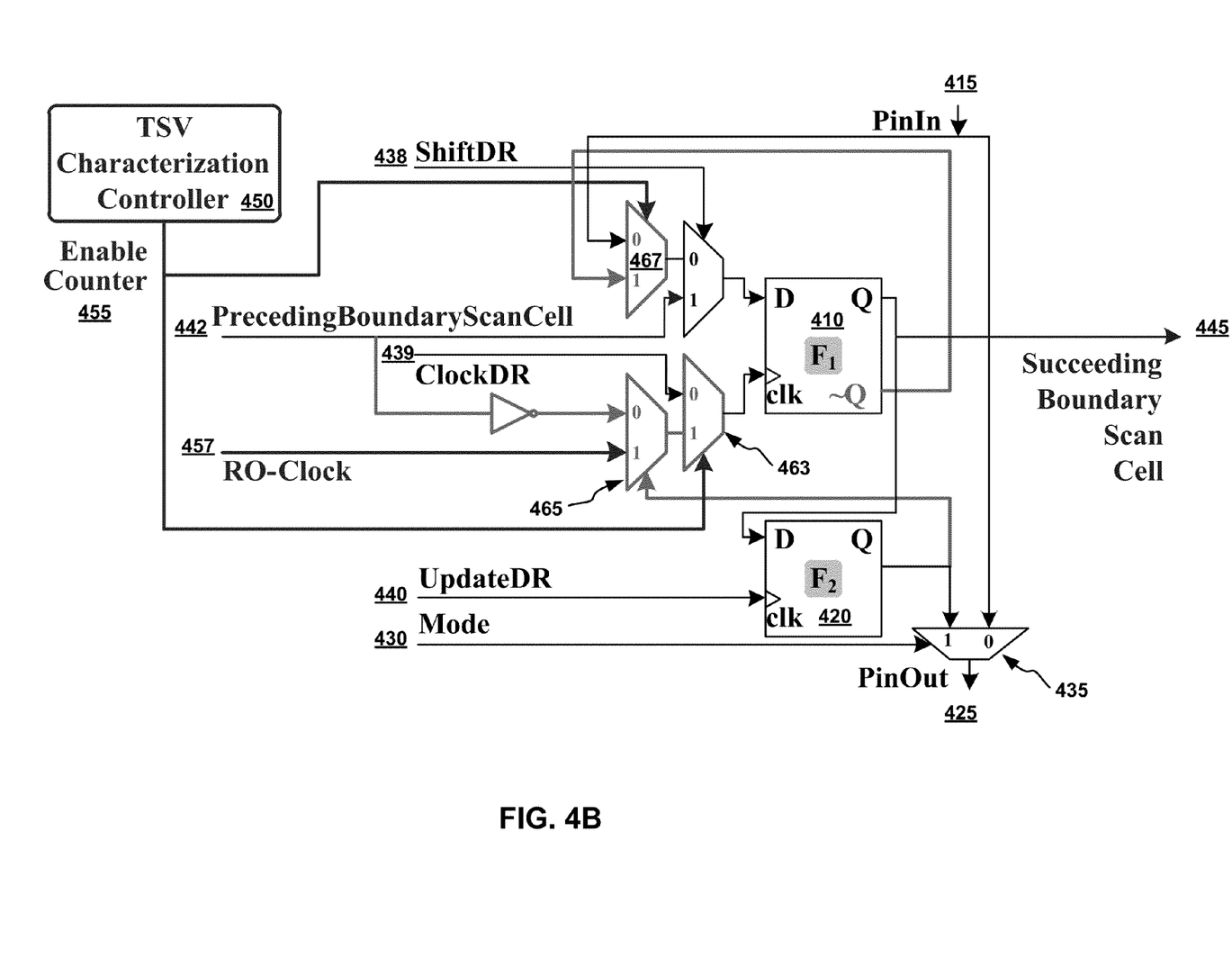
FIG. 4B illustrates an example of a boundary scan cell modified from the conventional boundary scan cell shown in FIG. 4A, which is configurable to operate as a bit of an asynchronous counter.

A test architecture according to various embodiments of the invention comprises a plurality of boundary scan cells, each of which can be configured to operate as, based on control signals, conventional boundary scan cells or any bit of an asynchronous counter. FIGS. 4A and 4B illustrate an example how a conventional boundary scan cell can be modified to become a boundary scan cell that can be used for testing interconnects.

FIG. 4A illustrates a conventional boundary scan cell in compliance with the IEEE Standard 1149.1. The boundary scan cell has two D-Flip-Flops, $F_1$ (410) and $F_2$ (420). PinIn (415) and PinOut (425) are connected to system logic. Mode (430) selects the input of the multiplexer (435) for PinOut (425). When ShiftDR (438) is 1, ClockDR (439) triggers the data in $F_1$ (410) to shift from PrecedingBoundaryScanCell (442) to SucceedingBoundaryScanCell (445) along the boundary scan chain. The data in $F_1$ (410) is triggered by UpdateDR (440) to propagate to $F_2$ (420).

FIG. 4B illustrates an example of a boundary scan cell modified from the conventional boundary scan cell shown in FIG. 4A. As shown in the figure, the flip flop $F_1$ (410) can operate as a bit of a ripple counter while the flip flop $F_2$ (420) is used to set the flip flop $F_1$ (410) as either the first bit of or any other bit of the ripple counter. Compared to the conventional boundary scan cell in FIG. 4A, two input signals, EnableCounter (455) and RO-Clock (457), and three multiplexers (463, 465, and 467) are added. The overall silicon area overhead may be reduced by sharing some logic between boundary scan cells and ripple-counters.

EnableCounter (455) is a global signal generated by a TSV Characterization Controller (450). When it is set as 0, the modified boundary scan cell operates as a conventional one. When it is set as 1 and ShiftDR (438) is set as 0, the output ~Q (463) of the Flip-Flop $F_1$ (410) drives its own input D and the Flip-Flop $F_1$ (410) thus operates as a counter bit, similar to the flip flops shown in FIG. 3.

The clk of $F_1$ (410) has three input signals: (1) ClockDR (439), which is a normal global test clock signal, (2) RO-Clock (457), which is an output signal of a local ring oscillator, and (3) ~Q (the inversion of 442), which comes from its preceding adapted boundary scan cell's $F_1$. When EnableCounter (455) is 1, the configuration bit in $F_2$ determines the input signal of $F_1$'s clk. As mentioned previously, the to-be-measured RO-Clock (457) only connects to the first counter bit in a ripple-counter. Hence, only when the configuration bit in $F_2$ is set as 1, $F_1$ (410) becomes the first counter bit, and the ring oscillator multiplexed to this $F_1$ (410) can be measured. In this way, the configuration $F_2$ bits in all of the modified boundary scan cells effectively determine which ring oscillators to be measured and how counters are dynamically configured along the boundary scan chain.

Figure 5A:
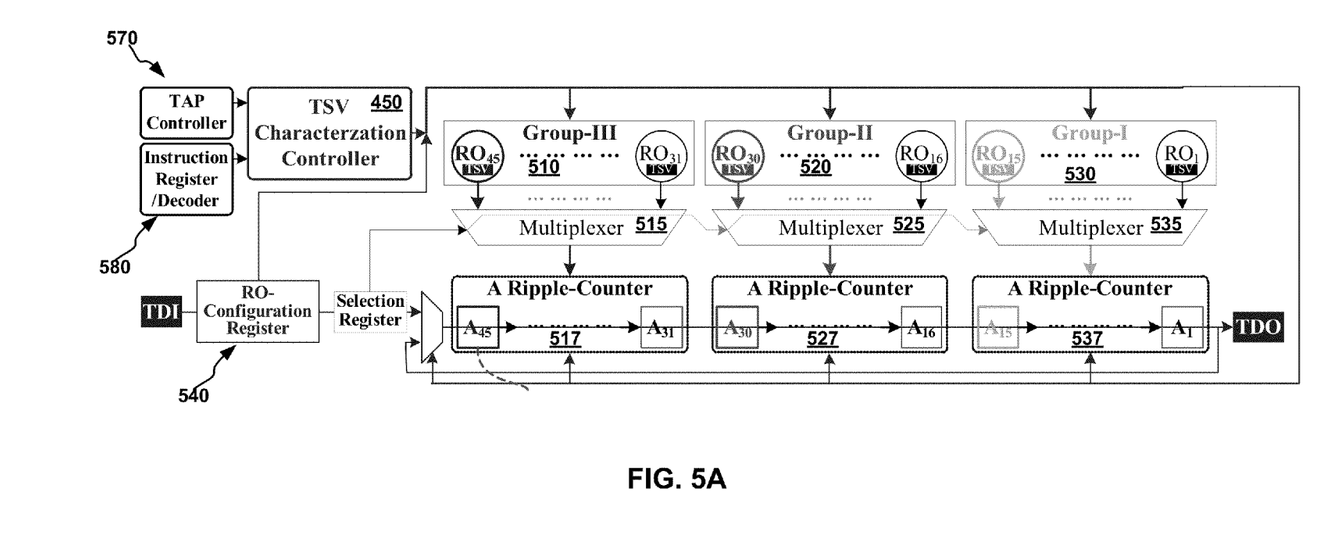
FIG. 5A illustrates an example of a test architecture that may be implemented according to various embodiments of the invention.

FIG. 5A illustrates an example of a test architecture that may be implemented according to various embodiments of the invention. Three groups of ring oscillators, $RO_{45}$-$RO_{31}$ (510), $RO_{30}$-$RO_{16}$ (520) and $RO_{15}$-$RO_1$ (530), are shown at the top of the figure. Each group contains fifteen ring oscillators. Each of the ring oscillators are used to characterize either one TSV for pre-bond testing or two TSVs for post-bond testing. Multiplexers 515, 525 and 535 may represent groups of multiplexers (e.g. each multiplexer in a group being the multiplexer 465 in FIG. 4B). Three 15-bit ripple counters 517, 527 and 537 are formed with boundary scan cells $A_{45}$-$A_{31}$, $A_{30}$-$A_{16}$ and $A_{13}$-$A_1$, respectively. Each of the boundary scan cells $A_1$-$A_{45}$ may be implemented using the one shown in FIG. 4B.

Control circuitry in FIG. 5A comprises a TSV Characterization Controller (450) and a RO-Configuration Register (540). Like the one shown in detail in FIG. 4B, the TSV Characterization Controller (450) may supply EnableCounter (455) signals to each of the boundary scan cells $A_1$-$A_{45}$. The TSV Characterization Controller (450) may also provide signals to activate the ring oscillators. The RO-Configuration Register (540) supplies ripple counter configuration information such as the configuration bit in $F_2$ (420) of each boundary scan cell. In fact, the $F_2$s of the boundary scan cells may constitute the RO-Configuration Register (540).

Figure 5B:
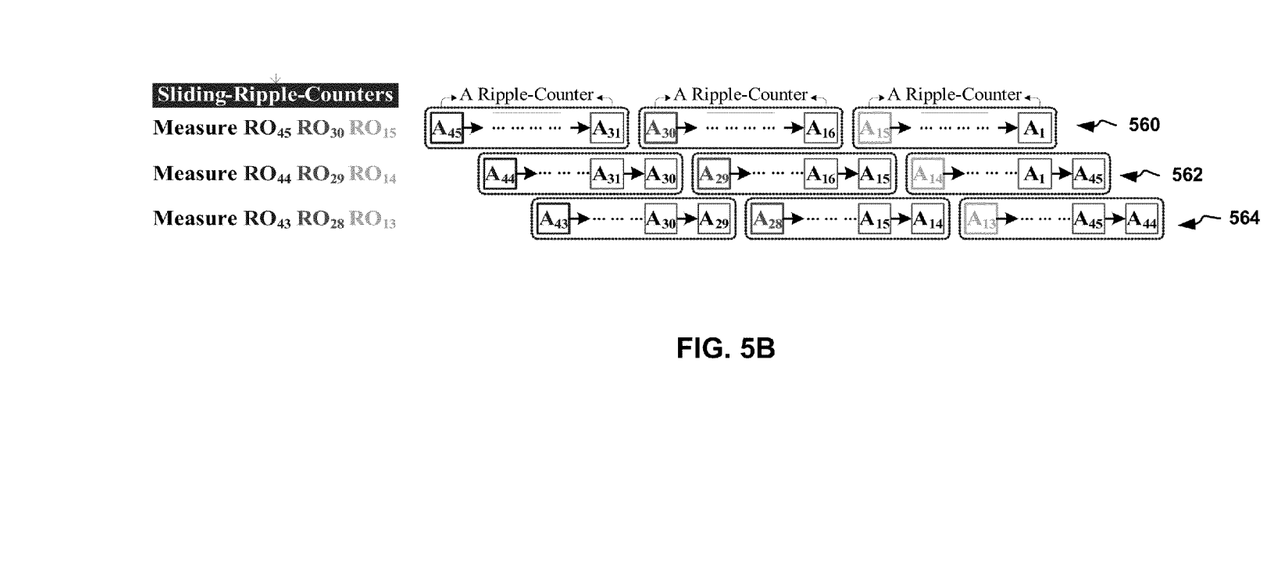
FIG. 5B illustrates three different ripple counter configurations for measuring different combinations of the ring oscillators in parallel.

Based on the ripple counter configuration information, different ripple counters may be configured. FIG. 5B illustrates three different ripple counter configurations for measuring different combinations of the ring oscillators in parallel. In configuration 560, boundary scan cells $A_{45}$-$A_{31}$, $A_{30}$-$A_{16}$ and $A_{15}$-$A_1$ forms three ripple counters for measuring the ring oscillators $RO_{45}$, $RO_{30}$ and $RO_{15}$, respectively; in configuration 562, boundary scan cells $A_{44}$-$A_{30}$, $A_{29}$-$A_{15}$ and $A_{14}$-$A_1$-$A_{45}$ forms three ripple counters for measuring the ring oscillators $RO_{44}$, $RO_{29}$ and $RO_{14}$, respectively; and in configuration 564, boundary scan cells $A_{43}$-$A_{29}$, $A_{28}$-$A_{14}$ and $A_{13}$-$A_1$-$A_{45}$-$A_{44}$ forms three ripple counters for measuring the ring oscillators $RO_{43}$, $RO_{28}$ and $RO_{13}$, respectively.

Figure 6:
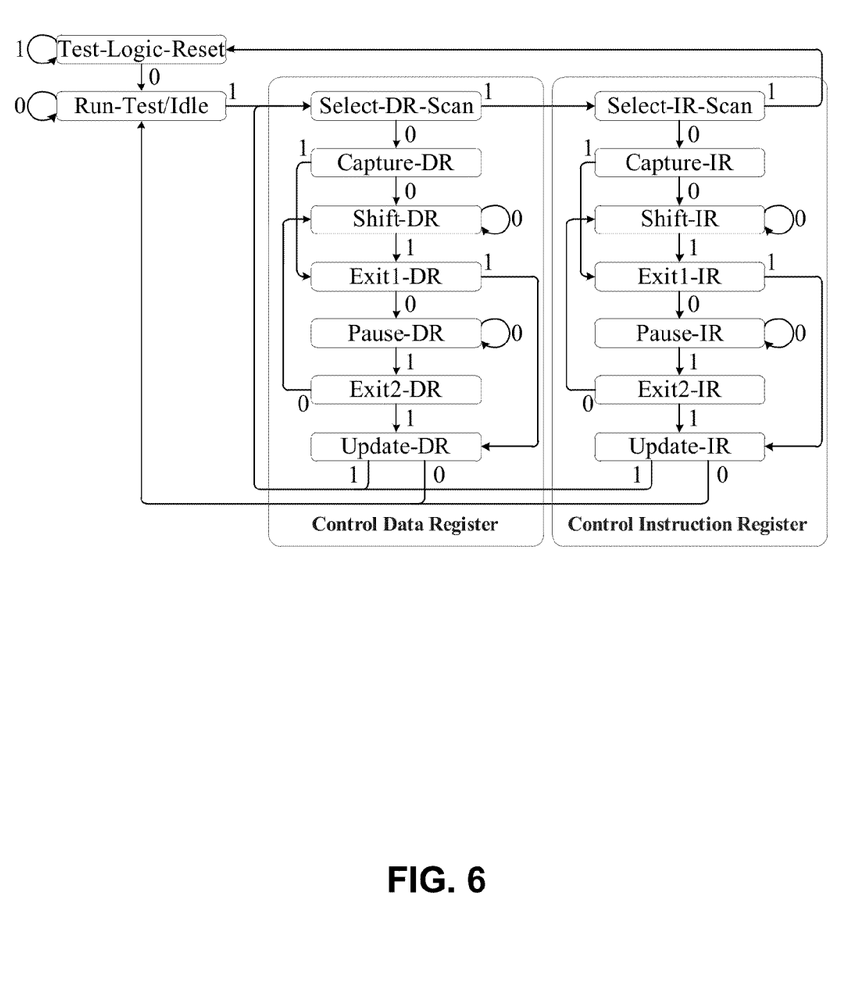
FIG. 6 illustrates the finite state machine of a TAP controller.
Figure 7:
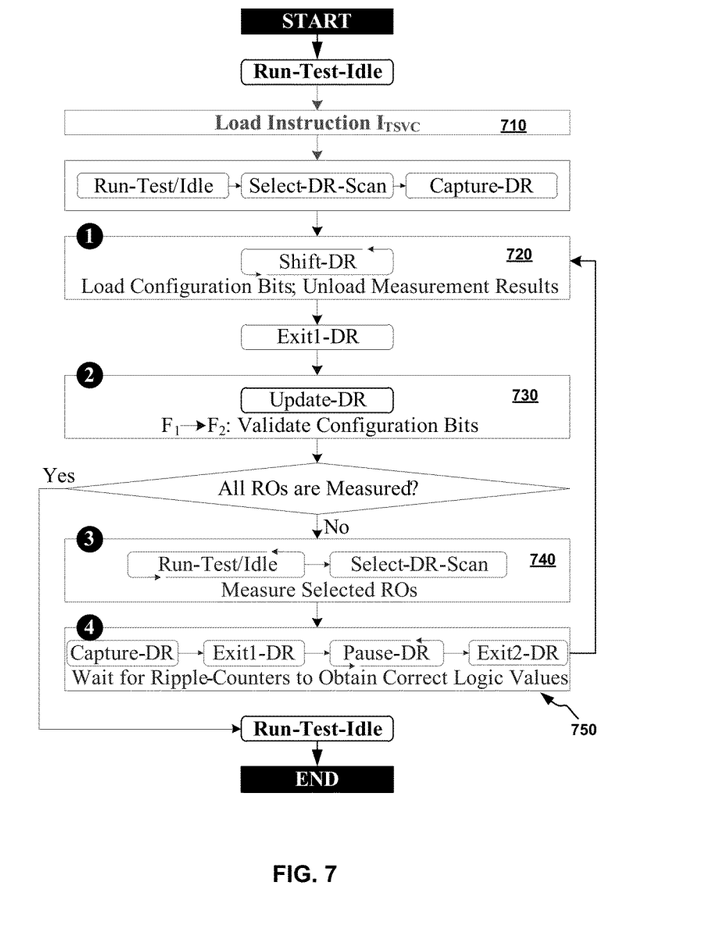
FIG. 7 illustrates an example of a test procedure that may be implemented according to various embodiments of the invention.

Various test access interfaces may be used for the ring-oscillator-based characterization of TSVs. One example is the test access architecture of IEEE Boundary Scan Standard 1149.1 (JTAG). In FIG. 5A, TAP controller 570 and Instruction Register/Decoder 580 are components of the JTAG. Post-bond testing may use the JTAG-compatible test access architecture described in a U.S. patent application Ser. No. 14/022, 216, filed on Sep. 9, 2013, entitled "Test Access Architecture For Stacked Dies", and naming Ronald Press et al. as inventors, which application is incorporated entirely herein by reference. FIG. 6 illustrates the finite state machine of a TAP controller, and FIG. 7 illustrates an example of a test procedure that may be implemented according to various embodiments of the invention. The following discusses in detail the test procedure illustrated in FIG. 7.

In operation 710, the instruction $I_{TSVC}$ is loaded and decoded by the instruction decoder, through the states of "Control Instruction Register". Then, by using the states of "Control Data Register", the ROs can be measured by the adapted boundary scan chain.

In operation 720, the TSV Characterization Controller generates two signals: EnableRO=0 and EnableCounter=0. Configuration bits of ring oscillators and ripple counters are shifted in to $F_1$s of the adapted boundary scan cells. Meanwhile, the measurement results are shifted out from $F_1$s. For post-bond testing, two bits are needed in the RO-Configuration Register for three post-bond RO configurations. If we use $N_{ABSC}$ to denote the number of adapted boundary scan cells, and use $P_{TCK}$ to denote the period of test clock, the test time consumed in this state is $(2+N_{ABSC}) \times P_{TCK}$.

In operation 730, a valid edge occurs at UpdateDR to propagate the loaded configuration bits in $F_1$s to $F_2$s of the adapted boundary scan cells. The states of $F_2$s define the to-be-measured ROs and the new configurations of sliding-ripple-counters. One test clock cycle is cost here.

In operation 740, EnableRO becomes 1 to activate the ROs, and EnableCounter becomes 1 to configure the boundary scan chain to the ripple-counters. ROs are measured here, and the measurement window $T_W$ can be adjusted by controlling the number of test clock cycles staying in the Run-Test/Idle state.

In operation 750, EnableRO becomes 0, but EnableCounter remains 1. This is used to wait for the ripple-counters to obtain correct logic values after the ROs are disabled. In general, for a ripple-counter with $N_{CB}$ counter bits, $N_{CB}$ test clock cycles are sufficient.

Next, the Shift-DR state is entered again, where EnableCounter becomes 0, so the ripple-counters are configured back into the boundary scan chain.

The test procedure ends when all of the ring oscillators are measured. Since at each time, one ring oscillator is selected from each group for parallel measurement, the number of parallel measurements is equal to the number of ROs in a group, denoted by $N_{RiG}$.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. An integrated circuit to be fabricated on a first die, comprising:
   a plurality of interconnection elements for communicating with another integrated circuit to be fabricated on a second die, the first die and the second die being stacked with one on top of the other or the first die and the second die being mounted on a same substrate;
   a plurality of boundary scan cells coupled to the plurality of interconnection elements, wherein each of the plurality of boundary scan cells can be configured to operate as, based on control signals, a conventional boundary scan cell or any bit of an asynchronous counter; and
   control circuitry that supplies the control signals.

2. The integrated circuit recited in claim 1, wherein the conventional boundary scan cell is an IEEE Standard 1149.1 compliant device.

3. The integrated circuit recited in claim 1, wherein the plurality of interconnection elements are through-silicon vias.

4. The integrated circuit recited in claim 1, further comprising:
   devices for constructing ring oscillators for pre-bond testing of the plurality of interconnection elements, post-bond testing of the plurality of interconnection elements, or both.

5. The integrated circuit recited in claim 4, wherein the control circuitry further supplies signals for enabling the ring oscillators.

6. One or more non-transitory processor-readable media storing processor-executable instructions for causing one or more processors to create a design of an integrated circuit to be fabricated on a first die, the integrated circuit comprising:
   a plurality of interconnection elements for communicating with another integrated circuit to be fabricated on a second die, the first die and the second die being stacked with one on top of the other or the first die and the second die being mounted on a same substrate;
   a plurality of boundary scan cells coupled to the plurality of interconnection elements, wherein each of the plurality of boundary scan cells can be configured to operate as, based on control signals, a conventional boundary scan cell or any bit of an asynchronous counter; and
   control circuitry that supplies the control signals.

7. The one or more non-transitory processor-readable media recited in claim 6, wherein the conventional boundary scan cell is an IEEE Standard 1149.1 compliant device.

8. The one or more non-transitory processor-readable media recited in claim 6, wherein the plurality of interconnection elements are through-silicon vias.

9. The one or more non-transitory processor-readable media recited in claim 6, wherein the integrated circuit further comprises:
   devices for constructing ring oscillators for pre-bond testing of the plurality of interconnection elements, post-bond testing of the plurality of interconnection elements, or both.

10. The one or more non-transitory processor-readable media recited in claim 9, wherein the control circuitry further supplies signals for enabling the ring oscillators.

* * * * *